United States Patent [19]

Thaler

[11] Patent Number: 4,981,717
[45] Date of Patent: Jan. 1, 1991

[54] DIAMOND LIKE COATING AND METHOD OF FORMING

[75] Inventor: Stephen L. Thaler, St. Louis, Mo.

[73] Assignee: McDonnell Douglas Corporation, St. Louis, Mo.

[21] Appl. No.: 315,340

[22] Filed: Feb. 24, 1989

[51] Int. Cl.$^5$ .......................... B05D 3/06; B01J 3/06; B01J 3/08

[52] U.S. Cl. .................................... 427/53.1; 427/38; 423/446

[58] Field of Search ............................ 427/53.1, 38, 39; 423/446

[56] References Cited

U.S. PATENT DOCUMENTS

| | | | |
|---|---|---|---|
| 4,343,628 | 8/1982 | Taylor | 51/298 |
| 4,504,519 | 3/1985 | Zelez | 423/446 |
| 4,568,565 | 2/1986 | Gupta et al. | 427/53.1 |
| 4,681,640 | 7/1987 | Stanley | 427/53.1 |
| 4,770,940 | 9/1988 | Ovshinsky et al. | 423/445 |
| 4,806,900 | 2/1989 | Fujimori et al. | 338/22 SD |
| 4,830,702 | 5/1989 | Singh et al. | 423/446 |
| 4,892,751 | 1/1990 | Miyake et al. | 427/53.1 |

FOREIGN PATENT DOCUMENTS

| | | | |
|---|---|---|---|
| 0033300 | 2/1985 | Japan | 423/446 |
| 0112697 | 6/1985 | Japan | 423/446 |
| 0180999 | 9/1985 | Japan | 423/446 |
| 1201694 | 9/1986 | Japan | 423/446 |
| 1236691 | 10/1986 | Japan | 423/446 |
| 62-164878 | 7/1987 | Japan | |
| 62-270495 | 11/1987 | Japan | |
| 62-278194 | 12/1987 | Japan | |
| 63-123896 | 5/1988 | Japan | |
| 63-144195 | 10/1988 | Japan | |
| 63-153278 | 11/1988 | Japan | |
| 63-312978 | 12/1988 | Japan | |
| 1-148791 | 6/1989 | Japan | |

OTHER PUBLICATIONS

Collins et al, "Laser Plasma Source of Amorphic Diamond", *Appl. Phys. Lett.*, 54(3), Jan. 16, 1989, pp. 216–218.

Primary Examiner—Shrive Beck
Assistant Examiner—Marianne L. Padgett
Attorney, Agent, or Firm—Edward H. Renner

[57] ABSTRACT

A method of depositing diamond-like films produces depositing species from a plasma of a hydrocarbon gas precurser. The plasma is generated by a laser pulse which is fired into the gas and is absorbed in an initiater mixed with the gas. The resulting detonation produces a plasma of ions, radicals, molecular fragments and electrons which is propelled by the detonation pressure wave to a substrate and deposited thereon.

19 Claims, 1 Drawing Sheet

DIAMOND LIKE COATING AND METHOD OF FORMING

BACKGROUND AND SUMMARY OF THE INVENTION

Diamond-like coatings are in great demand as protective coatings for optical components; as coatings in sliding wear parts such as valves, pistons, bearings and the like; as heat sinking materials in integrated circuit technology and as laser host material. Diamond-like coatings also have great potential as a integrated circuit semi-conductor material because of the very high heat transfer of such materials. By diamond-like coatings, applicant means coatings formed of carbonaceous species having characteristics of hardness and chemical structure similar to natural diamond, at least in part. Such coatings may include other species of chemicals and structure, at least in part.

Because of the great demand for these materials, techniques have been developed to produce this material. Common to all of the production techniques is the formation of a gas plasma as a source of free radicals and ions which form the depositing species and/or coating environment and which provides the transient energy required for diamond or diamond-like film nucleation. The conventional methods require radio frequency electronics to generate the plasma and require suitable filtering and collimating electrodes to extract and control the depositing species.

In addition, conventional methods require the provision of a means for insuring an electrical potential difference between the plasma region and the substrate to be coated, normally in the range of 100 to 1,000 electron volts potential difference. A further problem common to conventional methods of formation of diamond-like coatings is the requirement that adequate cooling be provided for the substrate, since the substrate is in close proximity to a very hot plasma. Conventional processes require that the substrate be maintained near room temperature as a key ingredient to forming diamond-like coatings. Heating of the coating films, either during formation or afterwards, will collapse the sp3 bonding characteristic of diamond films to a sp2 bonding, that is, will convert the diamond-like film to one of graphite.

Diamond-like coatings formed by state of the art methods notoriously have problems with adhesion to the substrate and are unable to support a shear stress. The industry recognizes a ten micron thickness limit as that which is attainable by conventional processes. The accumulation of diamond-like material above this limit incurs problems with the cohesive forces within the film which induces delamination of the film. Moreover, attempts to produce film beyond the ten micron thickness result in the collapsing of the sp3 hybrid to the sp2 bonding, that is, the formation of graphite. These films, above the ten micron thickness, have a very weak bond to the substrate such that the diamond-like coating can be easily scraped from the substrate, for example by application of a dental pick.

Conventional plasma assisted techniques for producing diamond-like coatings grow coatings which have separate, granular crystal structure, that is, an irregular geode-like appearance on microscopic examination. These films of discrete crystaline nature are unsatisfactory particularily when used as optical coatings since scattering of light as a result of the separate crystals can degrade the optical throughput.

With this process, continuous, tightly adhering, optically suitable diamond-like films may be deposited on substrates such as lenses, or on other surfaces subject to wear, without the use of the electronics and necessary in state of the art deposition processes. This method generates a plasma by the absorbtion of laser radiation into a precurser gas or gas mixture. The gas rapidly decomposes to produce the accelerating forces and the depositing species necessary to produce diamond-like coatings. Externally generated accelerating fields or potentials between the gas and the substrate are not required. Moreover, it is not necessary to substantially heat the substrate prior to deposition. Instead, the plasma region may be spaced from the substrate and generated intermittently, for example at ten microseconds duration, so that the temperature excursions are transient and high energies are developed to propel the deposition species onto the substrate. This system does not require a sophisticated vacuum system, as do conventional methods, since the coatings may be produced at atmospheric pressure as well as at reduced pressured. For example, applicant's process may typically operate at one to 100 torr total pressure. Conventional deposition processes normally take place at millitorr pressures.

This process may also work to provide deposition coverage of substantially greater areas than previous techniques. Previously, the art required collimated beams or very localized plasma mixtures which result in small area coverage. This process may be used over much wider areas. Moreover these films may be much thicker than conventional films. This process has produced films of greater than ten microns thickness. At this thickness the films have very high adhesion to the substrate. Standard pull tests indicate that the films may withstand in excess of 10,000 psi pulling pressure. The films are also very strong in shear stress. A Sebastian pulling post can be pulled through twenty degrees on removal of this film.

In addition to coating flat substrates, this process may produce coatings over curved or irregular surfaces as well. Coated surfaces of this type would be highly valuable on curved lenses, on nosecones, aircraft canopies and on windows. The films have a high degree of lubricity as well as hardness and durability.

It is an object of this invention to produce tightly adhering diamond-like coatings on substrates and to produce substrates having the diamond-like coatings thereon.

It is a further object of this invention to produce diamond-like coatings having superior optical, electrical, electronic, thermal and mechanical properties.

It is also an object of this invention to produce diamond-like coatings from a laser induced plasma and to develop a method for producing such coatings.

It is an object of this invention to develop a method of producing diamond-like coatings by absorbing laser produced energy into a coating precurser gas.

It is an object of this invention to develop a method of producing diamond-like coatings by absorbing laser energy into a plasma initiator.

It is an object of this invention to develop a method of producing diamond-like coatings from a precursor gas by initiating and propagating a laser induced plasma therein.

These and other objects will be apparent from the following Description of the Drawings and Description of the Preferred Embodiments.

DESCRIPTION OF THE PREFERRED EMBODIMENT

Figure 1:
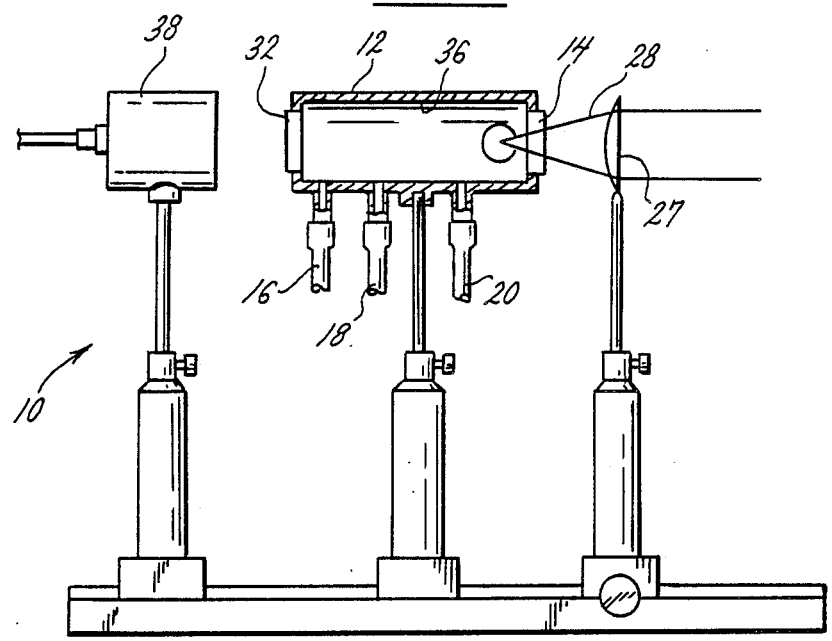
FIG. 1 is a schematic diagram of an apparatus for performing the laser deposition process.

This process utilizes the cracking of fluorocarbons as well as hydrocarbons to produce a plasma in which radicals are generated and propelled onto a surface to produce a diamond-like coating. This coating has properties of both diamond as well as fluorocarbons. The coating is very hard carbon and is self lubricating in nature. A precursor gas such as a hydrocarbon, for example methane, ethane, propane, ethylene, acetylene or similar hydrocarbon gases and vapors may be used as the precursor for the diamond-like coating. This gas is cracked by intense heat to form a variety of high energy fragments, ions, radicals and free electrons which are propelled toward the substrate and deposited thereon. Cracking to break the hydrocarbon gas or vapor into fragments is achieved by subjecting the hydrocarbon to intense laser pulses, for example, $CO_2$ laser having a 50 nanosecond spike and a power output of $10^{14}$ watts/cm$^2$.

This laser impulse is absorbed by an initiator which is mixed with the hydrocarbon gas or vapor. The initiator is preferably a compound which is strongly absorbing at the output wave length of the laser impulse used. The output wave length of a ruby laser is 6943 angstroms and a helium-neon laser output wave length is 6328 angstroms, for example. The output wave length for a $CO_2$ laser is 10.6 microns. I have found that sulfurhexafluoride is a highly effective initiator, when used with a $CO_2$ laser, providing both sulfur and fluoride ions and radicals on detonation. The sulfur and fluoride ions react variously with hydrocarbon and carbon species formed on detonation. Due to the high IR irradiance levels and the presence of the highly absorbant molecule $SF_6$ (sulfurhexafluoride), which is strongly attenuating at 10.6 microns wave length (the output of the $CO_2$ laser), a high amount of laser energy is rapidly accumulated in a very small volume and is released explosively, fragmenting the hydrocarbon into highly reactive ions and radicals and imparting high translational energy of from ten to 100 electron volts to the formed gases. The detonation produces a plasma from the gas mixture and generates a high energy detonation wave in the plasma. The presence of a plasma propagating gas, such as nitrogen or air, also aids in propagating the detonation wave and plasma generation throughout the entire volume of the mixture. The ejected carbon, hydrocarbon or other fragments and electrons receive the required transient energy from the plasma to create diamond-like materials.

Moreover, it is believed that the detonation wave produces a shower of electrons which presputters the substrate, locally heating it and preparing the surface for the later arriving depositing species so that a very high adhesion of the coating to the substrate is achieved. It is believed that the tremendous surge of energy produced in the pressure wave on detonation produces an effective local temperature of thousands of degrees at the substrate and pressure in the range of thousands of kilobars. The duration of these transients of temperature and pressure is quite small, but is effective to produce the diamond-like species from the precurser hydrocarbon gas and propel the species onto the substrate surface and produce a tightly adhering bond between the diamond-like structure and the substrate.

Figure 2:
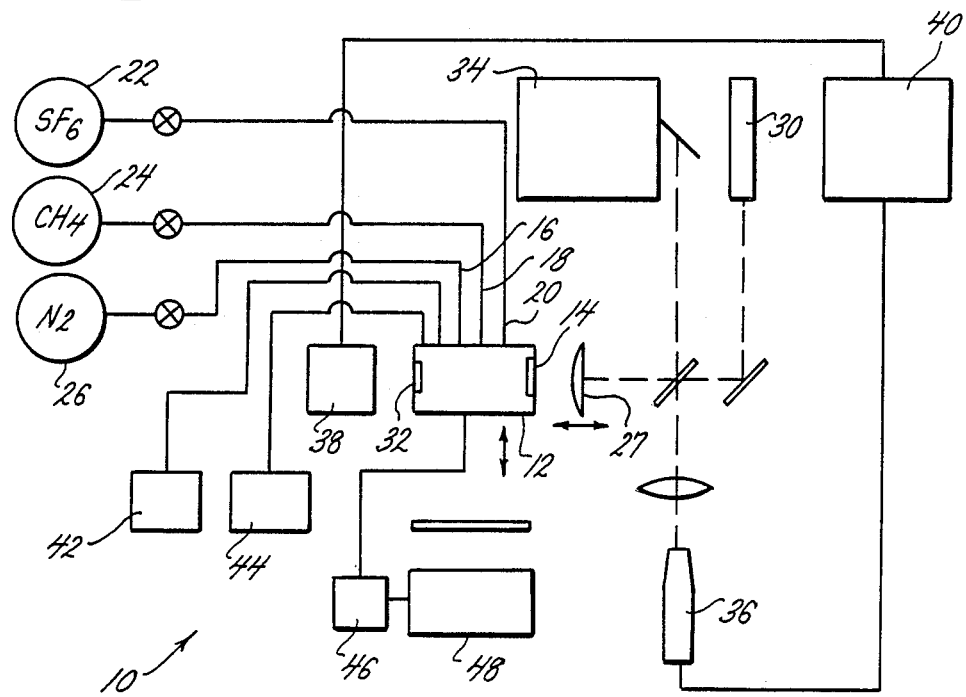
FIG. 2 is a second schematic diagram of the apparatus of FIG. 1.

The schematic views of FIGS. 1 and 2 show an apparatus 10 for producing diamond-like coatings. The apparatus 10 includes a machined aluminum box 12 which has a window 14 and gasports 16, 18 and 20 which permit the box 12 to be filled with mixtures of sulfurhexafluoride, methane and nitrogen from tanks 22, 24 and 26. A two joule pulsed $CO_2$ laser beam 28 (10 Hz cycle at 10.6 microns) is transmitted into the box 12 through the IR transmissive window 14 which may be ZnS or ZnSe. A one inch focal length for, example in a ZnSe lens 27 assures enough gain to initiate the detonation of the gaseous mixture by the laser beam 28.

Prior to initiating deposition, a helium-neon laser 30 was used to designate a strike zone on the glass substrate 32. The $CO_2$ laser 34 was then fired along the helium-neon path into the plasma cell 12. A photon drag detector 36 was used to monitor the $CO_2$ laser pulse characteristics and a silicon photodiode 38 placed just behind the test cell, as shown, which was used to register the emissions from the plasma. The detectors 36 and 38 were linked to a recorder 40, as shown. The apparatus 10 was also outfitted with thermocouple 42 and pressure sensor 44 and with a pump 46 and residual gas analysis unit 48, as shown. The air in the box 12 was evacuated to about ten torr and the box 12 was backfilled with $SF_6$ at sixty torr and $CH_4$ at 100 torr. The gas was then detonated as decribed above.

Deposition of diamond-like material occurs over the entire interior 36 of box 12. The character of the material deposited varies with the distance from the plasma sheath. Deposits adjacent to the plasma on the IR window 14 were smooth, continuous and between about five to ten microns in thickness. The deposits on the IR window 14 were extremely hard, tightly adhering and had superior optical properties. The depth of the deposits on the IR window 14 may be tuned to increase or decrease the diamond-like character and conversely increase or decrease the fluorocarbon-like character by adjustment of the focus of the laser beam 28 toward or away from the substrate 32. Deposits occuring on the substrate 32, the rear glass window, were considerably thicker and more granular than those occuring on the IR window 14, yet were similar in composition and were tightly adhering. The materials on window 32 were quite satisfactory as an abrasive surface.

Analysis of the coatings found in the box 12 indicated a very hard, fluorocarbon containing, diamond-like material having tight bond to the substrate 32 and window 14. Substantial hand pressure was required with a steel spatula to remove the granular material from the glass substrate 32. The coating on the ZnSe lens, window 14, was also very hard and tightly bonding and suitable to protect the window 14 from rain and/or ice erosion. Rain and ice are a problem for IR windows, such as the IR lenses used on weather cameras, which are typically made from soft material. In addition, the smooth coatings appeared to have very high lubricating properties and would be suitable for parts subject to sliding friction such as valves, pistons and bearings. As noted above, the larger grained deposits appeared to be excellent as abrasive coatings. They would be suitable on grinding wheels or blades or on glass or metal substrates. The adhesion of the coatings was very high and the material was sufficiently hard to scratch glass. Thin, smooth diamond-like coating appeared to have sufficient hardness and suitable electrical properties that it could be used as a microelectronic substrate, for example, as a substrate for electronic circuitry prepared by photolithographic processes.

Figure 3:
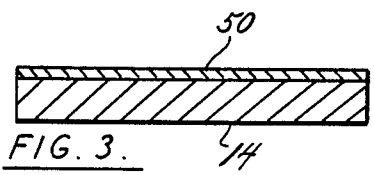
FIG. 3 is a partial cross sectional view of a coated substrate.

As shown in FIG. 3, the diamond-like coating 50 is formed as a hard, tightly adhering coating on substrate 14, the IR window. The diamond-like coating 50 has a thickness of about ten microns. As so coated, IR window 14 would be suitable for use as an IR window or lens subject to erosion from exposure to ice, rain and other abrasive environments. While FIG. 3 shows the substrate as being the IR window 14, it will be appreciated that glass substrate 32, or metal or any other substrate material can be used.

It will be appreciated that various changes and modifications may be made to the embodiments disclosed herein within the purview of the invention. The invention is not to be limited to the specific embodiments disclosed herein for purposes of illustration, but only by the scope of the claims appended hereto and their equivalents.

I claim:

1. A method of producing diamond-like coatings comprising confining a plasma initiating precursor gas containing a hydrocarbon and introducing a laser generated beam into the gas; the laser generated beam initiating a plasma in the precursor gas and creating diamond-like precursor fragments from the precursor gas, the plasma propelling the fragments onto a substrate and bonding the fragments to the substrate as a diamond-like coating.

2. The method of claim 1 wherein the precursor gas is confined at a pressure of up to about one atmosphere.

3. The method of claim 1 wherein the laser beam is generated by a $CO_2$ laser.

4. The method of claim 1 wherein the precursor gas contains a plasma propagating gas.

5. The method of claim 4 wherein the plasma propagating gas is nitrogen.

6. The method of claim 1 wherein the precursor gas contains sulfur hexafluoride.

7. A method of producing diamond-like coatings comprising confining a hydrocarbon containing precursor gas, the precursor gas containing a plasma initiator, and introducing a laser generated beam into the gas, the laser generated beam initiating a plasma in the precurser gas and creating diamond-like precursor fragments from the precursor gas, the plasma propelling the fragments onto a substrate and bonding the fragments to the substrate as a diamond-like coating.

8. The method of claim 7 wherein the plasma initiator is a gas which strongly absorbs in the wave length of the laser generated beam.

9. The method of claim 8 wherein the plasma initiator is sulfurhexafluoride.

10. The method of claim 7 wherein the precursor gas contains a plasma propagating gas.

11. The method of claim 10 wherein the plasma propagating gas is nitrogen.

12. The method of claim 10 wherein the initiator is sulfurhexafluoride, the laser is a $CO_2$ laser, and the plasma propagator is nitrogen.

13. The method of claim 7 wherein the laser beam is generated by a $CO_2$ laser.

14. The method of claim 7 wherein the precursor gas is confined at a pressure of up to about one atmosphere.

15. The method of claim 7 wherein the plasma produced diamond-like coating is a tightly adhering coating containing fluorocarbon moities.

16. A method of producing diamond-like coatings comprising confining a hydrocarbon containing precursor gas, the precursor gas also containing a plasma initiator and a plasma propagator, the precursor gas containing hydrocarbon, plasma initiator and plasma propagator in proportions effective to produce and sustain a diamond-like coating producing plasma, the precursor gas being confined at pressures up to about one atmosphere, the plasma initiator being strongly attenuating to the wave length of a laser beam, introducing a laser beam of the attenuating wave length into the precursor gas, the laser beam initiating a plasma in the precursor gas and creating diamond-like precursor fragments from the precursor gas, the plasma propagating throughout the extent of the precursor gas and propelling the fragments onto the substrate and bonding the fragments to the substrate as a diamond-like coating.

17. The method of claim 16 wherein the initiator is sulfurhexafluoride, the laser is a $CO_2$ laser, and the plasma propagator is nitrogen.

18. The method of claim 17 wherein the plasma produced diamond-like coating contains fluorocarbon moities.

19. The method of claim 17 wherein the plasma produced diamond-like coating contains fluorocarbon moities.

* * * * *

UNITED STATES PATENT AND TRADEMARK OFFICE
CERTIFICATE OF CORRECTION

PATENT NO. : 4,981,717

DATED : January 1, 1991

INVENTOR(S) : Stephen L. Thaler

It is certified that error appears in the above-identified patent and that said Letters Patent is hereby corrected as shown below:

On the title page, below the ABSTRACT, "19 Claims" should be --18 Claims--.

Column 2, line 6, after "electronics and", add "electrodes".

Column 2, line 24, delete "pressured", insert "pressure".

Column 6, lines 48, 49 and 50, delete all of claim 19.

Signed and Sealed this

Ninth Day of June, 1992

Attest:

DOUGLAS B. COMER

*Attesting Officer*  *Acting Commissioner of Patents and Trademarks*